United States Patent
Clevenger et al.

(10) Patent No.: US 9,806,018 B1
(45) Date of Patent: Oct. 31, 2017

(54) COPPER INTERCONNECT STRUCTURES

(71) Applicant: International Business Machines Corporation, Armonk, NY (US)

(72) Inventors: Lawrence A. Clevenger, Rhinebeck, NY (US); Wei Wang, Schenectady, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/186,600

(22) Filed: Jun. 20, 2016

(51) Int. Cl.
 *H01L 23/48* (2006.01)
 *H01L 23/522* (2006.01)
 *H01L 23/532* (2006.01)
 *H01L 21/768* (2006.01)

(52) U.S. Cl.
 CPC .... *H01L 23/5226* (2013.01); *H01L 21/76802* (2013.01); *H01L 21/76843* (2013.01); *H01L 21/76844* (2013.01); *H01L 21/76846* (2013.01); *H01L 21/76856* (2013.01); *H01L 21/76873* (2013.01); *H01L 21/76879* (2013.01); *H01L 23/53238* (2013.01); *H01L 23/53266* (2013.01)

(58) Field of Classification Search
 CPC ........... H01L 23/5226; H01L 23/53238; H01L 23/53266; H01L 21/76879; H01L 21/76843; H01L 21/76856; H01L 21/76802
 See application file for complete search history.

(56) References Cited

U.S. PATENT DOCUMENTS

| 6,249,055 | B1 | 6/2001 | Dubin |
| 6,492,270 | B1* | 12/2002 | Lou ........................ H01L 21/288 257/E21.174 |
| 6,607,982 | B1 | 8/2003 | Powell et al. |
| 6,747,355 | B2 | 6/2004 | Abiru et al. |
| 6,790,767 | B2 | 9/2004 | Lee |

(Continued)

OTHER PUBLICATIONS

A. S. Oates, "Strategies to Ensure Electromigration Reliability of Cu/Low-k Interconnects at 10 nm," ECS Journal of Solid State Science and Technology, vol. 4, No. 1, 2015, pp. N3168-N3176.

(Continued)

*Primary Examiner* — A. Sefer
(74) *Attorney, Agent, or Firm* — Cantor Colburn LLP; Vazken Alexanian

(57) ABSTRACT

Semiconductor devices include a patterned dielectric layer overlaying a semiconductor substrate; a metal layer comprising copper disposed in the patterned dielectric layer; and a barrier layer formed at an interface between the dielectric layer and the metal layer, wherein the barrier layer is AlOxNy. The patterned dielectric may define a trench and via interconnect structure or first and second trenches for a capacitor structure. Also disclosed are processes for forming the semiconductor device, which includes subjecting the dielectric surfaces to a nitridization process to form a nitrogen enriched surface. Aluminum metal is then conformally deposited onto the nitrogen enriched surfaces to form AlOxNy at the aluminum metal/dielectric interface. The patterned substrate is then metallized with copper and annealed. Upon annealing, a copper aluminum alloy is formed at the copper metal/aluminum interface.

10 Claims, 5 Drawing Sheets

(56) References Cited

U.S. PATENT DOCUMENTS

| | | | |
|---|---|---|---|
| 7,049,170 B2 * | 5/2006 | Savastiouk | H01L 23/13 257/E23.008 |
| 7,135,733 B2 | 11/2006 | Downey et al. | |
| 7,651,943 B2 | 1/2010 | Yu et al. | |
| 8,461,683 B2 | 6/2013 | Yoo et al. | |
| 8,907,483 B2 | 12/2014 | Zhao et al. | |
| 2004/0048203 A1 * | 3/2004 | Furusawa | H01L 21/02063 430/314 |
| 2006/0252240 A1 | 11/2006 | Gschwandtner et al. | |
| 2009/0039518 A1 * | 2/2009 | Feurprier | H01L 21/31116 257/773 |
| 2009/0209099 A1 * | 8/2009 | Yu | H01L 21/76831 438/653 |
| 2010/0112806 A1 | 5/2010 | Matsumoto et al. | |
| 2011/0079907 A1 * | 4/2011 | Farooq | H01L 23/53238 257/751 |
| 2011/0163062 A1 | 7/2011 | Gordon et al. | |
| 2013/0000962 A1 * | 1/2013 | Yang | H01L 21/76846 174/257 |
| 2013/0056837 A1 * | 3/2013 | Ng | H01L 21/823807 257/410 |
| 2013/0260553 A1 | 10/2013 | Yoo et al. | |
| 2014/0008799 A1 * | 1/2014 | Jong | H01L 23/485 257/751 |
| 2014/0084472 A1 * | 3/2014 | Sun | H01L 23/481 257/751 |
| 2014/0299988 A1 | 10/2014 | Cabral, Jr. et al. | |
| 2014/0332961 A1 | 11/2014 | Lee et al. | |
| 2014/0353835 A1 | 12/2014 | Chae et al. | |
| 2015/0024588 A1 * | 1/2015 | Chen | H01L 21/76843 438/653 |
| 2015/0179581 A1 * | 6/2015 | Chen | H01L 23/53238 257/751 |
| 2015/0262869 A1 | 9/2015 | Naik et al. | |
| 2015/0296995 A1 | 10/2015 | Krim et al. | |

OTHER PUBLICATIONS

D.-C. Perng et al., "Self-forming AlO x layer as Cu diffusion barrier on porous low-k film," Thin Solid Films, vol. 518, No. 6, 2010, pp. 1648-1652.

K. Maekawa et al., "Impact of Al in Cu alloy interconnects on electro and stress migration reliabilities," Microelectronic Engineering, vol. 85, 2008, pp. 2137-2141.

S.-F. Ding, et al., "Investigation of ultra-thin Al 2 O 3 film as Cu diffusion barrier on low-k (k=2.5) dielectrics," IEEE International Interconnect Technology Conference and Materials for Advanced Metallization (IITC/MAM), 2011, 3 pages.

* cited by examiner

COPPER INTERCONNECT STRUCTURES

BACKGROUND

The present invention generally relates to semiconductor integrated circuits, and more particularly, to the structure and formation of diffusion barrier structures that create insulation and prevent interdiffusion of copper.

An integrated circuit (IC) generally includes a semiconductor substrate in which a number of device regions are formed by diffusion or ion implantation of suitable dopants. This substrate usually involves a passivating and an insulating layer required to form different device regions. The total thickness of these layers is usually less than one micron. Openings through these layers (called vias or contact holes) allow electrical contact to be made selectively to the underlying device regions. A conducting material such as copper is used to fill these holes, which then make contact to the appropriate region of the semiconductor device.

The presence of a diffusion barrier, i.e., liner layer, on the sidewalls defining the openings is desirable because structural delamination and/or conductor metal diffusion can occur unless there is a layer of protection between the conductive layer and the etched insulating layer. For structural integrity, the liner layer should line the entire sidewall and generally cover the bottom surface of any vias as well.

By way of example, the resistance of copper used in interconnects increases exponentially as CMOS devices continue to be scaled down. This effect imposes substantial propagation delay on the microelectronic circuit. In the dielectric/liner/Cu scheme, several factors contribute to the high interconnect resistance for the 10 nm node and below: the high resistivity of the Cu liner and the increase of Cu resistivity due to surface and grain boundary electron scattering. Among these factors, liner resistance accounts for the major portion of interconnect resistance. For example, TaN is a common Cu barrier material and has a resistivity (~300 µohm-cm) that is about 150 times higher than Cu resistivity. For 10 nm node and below, the presence of the liner layer reduces copper volume within the openings by approximately 30-50%. Therefore, further reducing liner resistivity is extremely important to reducing interconnect resistance, meeting interconnect resistance requirements, and improving device performance.

SUMMARY

The present invention is generally directed to a semiconductor device and methods for forming a semiconductor device. In one or more embodiments, the semiconductor device includes a patterned dielectric layer overlaying a semiconductor substrate; a metal layer comprising copper deposited in the patterned dielectric layer; and a barrier layer at an interface between the dielectric layer and the metal layer, wherein the barrier layer is AlOxNy.

A method for forming a semiconductor device includes providing a patterned substrate including a trench structure and a via structure in a dielectric layer; exposing the surfaces of the trench and via structures with nitrogen ions to form a nitrogen enriched surface on and/or in a portion of the dielectric layer defining the trench and via structures; conformally depositing an aluminum metal layer onto the exposed surfaces of the trench and via structures in the presence of oxygen species in the dielectric to form an AlOxNy liner layer with the nitrogen enriched surface; depositing a copper metal into the trench and via structures; and annealing to form a copper aluminum alloy at an interface of the copper metal and the aluminum metal layer.

In one or more embodiments, a method for forming a semiconductor device includes providing a patterned substrate comprising a first trench and a second trench in a dielectric layer, wherein the first and second trenches are spaced apart at a distance from 10 Angstroms to 200 Angstroms; conformally depositing an aluminum metal layer onto the exposed surfaces defining the first and second trenches; forming $Al_2O_3$ with oxygen species present in the dielectric layer at an interface between the dielectric layer and the aluminum metal layer; depositing a copper metal into the first and second trenches; and annealing to form a copper aluminum alloy at an interface of the copper metal and the aluminum metal layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention generally relates to a copper interconnect structure and process for forming the copper interconnect structures. The structures and processes generally include formation of an aluminum oxynitride (AlOxNy) liner layer prior to deposition of the copper metal to reduce line and via resistances. In one or more embodiments, aluminum metal and the aluminum oxynitride liner layer is used to replace the prior art TaN/Co liner layer in the interconnect structure to reduce line and via resistances, wherein TaN/Co is known to exhibit a resistivity of about 300 micro-ohms-cm. The AlOxNy layer is selectively formed at an interface between the aluminum and dielectric layers to function as a copper diffusion barrier layer. In some embodiments, the aluminum metal is then deposited onto the AlOxNy liner layer and can also be deposited on the bottom of the via, i.e., in direct contact with an underlying copper metal interconnect, thereby advantageously reducing via resistance. Advantageously, the presence of the aluminum at the interface with copper results in formation of a CuAl alloy upon annealing. CuAl alloys are reported to have a resistance ranging from 8 to 14 micro-ohms-cm, which is much lower than the resistivity of the prior art TaN. Additionally, CuAl alloys are well known for having higher electromigration resistance then pure copper or pure aluminum.

Figure 1:
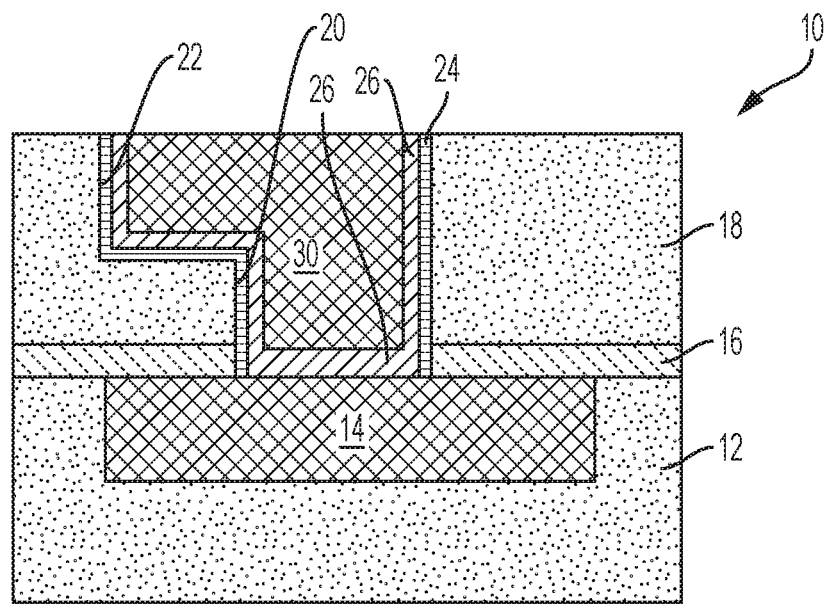
FIG. 1 illustrates a cross-sectional view of an exemplary semiconductor device including an interconnect structure including a dielectric/AlOxNy/Al/Cu liner structure.

FIG. 1 illustrates a cross-sectional view of an exemplary semiconductor device 10 including an interconnect structure that includes a dielectric/AlOxNy/Al/Cu liner structure in accordance with the present disclosure. The semiconductor device 10 generally includes a first dielectric layer 12, a first copper metal layer 14, a capping layer 16 disposed thereon, a second dielectric layer 18, and via and trench features 20, 22, respectively, formed in the second dielectric layer 18. The exposed second dielectric surfaces 18 defining the via and trench features have been exposed to a pre-treatment nitriding process to provide nitrogen ions on and in the exposed surfaces. A pure aluminum (Al) layer 26 is the deposited onto second dielectric surfaces 18 of the via and trench features 20, 22, wherein the combination of the Al and the nitrogen exposed dielectric surface in the presence of oxygen species in the dielectric results in the subsequent formation of an AlOxNy liner layer 24. The aluminum can also be formed on the bottom of the via 20 in direct contact with the first copper metal layer 14 as shown, i.e., the AlOxNy liner is not formed directly on the first copper metal layer 24. The structure 10 further includes copper metallization of the so-formed trench and via so as to provide a copper metal interconnect 30.

The pure Al layer is deposited onto the nitrogen exposed second dielectric surfaces 18 of the via and trench features 20, 22 by a deposition process such as, for example, atomic layer deposition (ALD), chemical vapor deposition (CVD), plasma enhanced chemical vapor deposition (PECVD), sputtering, chemical solution deposition, or plating. The thickness of Al layer ranges from 0.5 Angstroms to 250 Angstroms. The resulting AlOxNy liner layer 24 formed at the interface between the dielectric layer 18 and the aluminum 26 serves as a barrier to prevent the subsequently deposited copper conductive interconnect material from diffusing through to the dielectric layer 18 and is formed naturally by reaction between Al and the dielectric at room or elevated temperature. The thickness of the resulting AlOxNy liner layer may vary depending on the exact means of the deposition process as well as the extent of nitridization employed. In some embodiments, the thickness of the AlOxNy liner layer 24 is less than 50 Angstroms, in other embodiments, the thickness of the AlOXNy liner layer 24 is less than 25 Angstroms, and in still other embodiments, the thickness of the AlOXNy liner layer 24 is less than 10 Angstroms.

Figure 2:
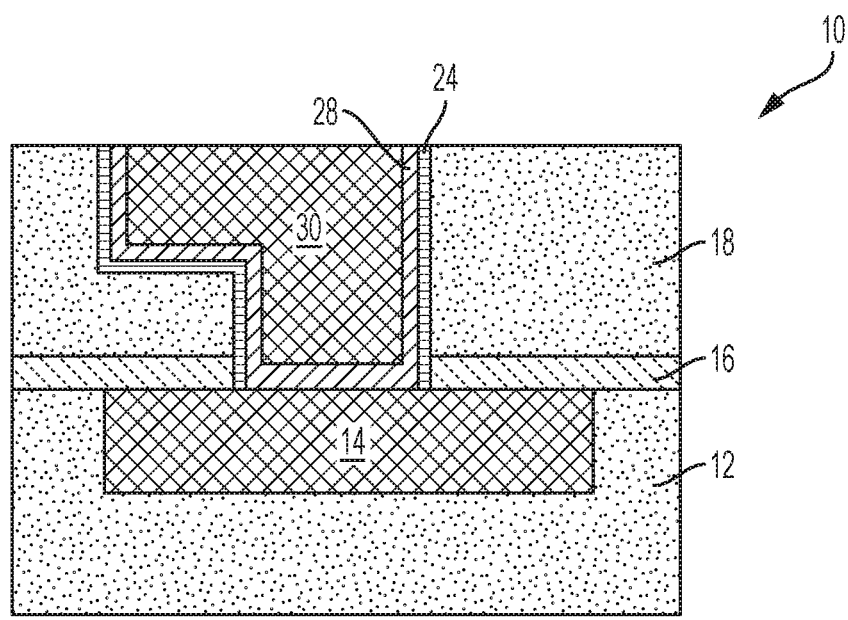
FIG. 2 illustrates a cross-sectional view of the exemplary semiconductor device of FIG. 1 after annealing.

FIG. 2 illustrates a cross-sectional view of the exemplary semiconductor device 10 after annealing. As shown, interdiffusion between the copper and the aluminum layer results in the formation of a CuAl alloy 28 is formed at the interface between the aluminum and copper. Annealing is believed to cause the copper as well as the aluminum to interdiffuse, which advantageously further reduces resistance and increases reliability. Depending on the extent of annealing, a gradient may be formed in the AlCu layer 28 with a higher aluminum concentration at about the interface with the AlOxNy layer 24.

The dielectric layers, 18, e.g., an interlevel dielectric layer, may comprise any dielectric material including inorganic dielectrics or organic dielectrics. The dielectric material may be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer may be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate 10.

The capping layer 16 protects the underlying metal conductive line 14 from oxidation, humidity, and contamination during processing of the next metal levels on the semiconductor wafer 10. Additionally, capping layer 16 serves to prevent undesirable diffusion of the underlying conductive line 14 into dielectric layer 18. Capping layer 16 can be made of any suitable capping material such as silicon nitride, silicon carbide, silicon oxycarbide, hydrogenated silicon carbide, silicon dioxide, organosilicate glass, and other low-k dielectrics.

Figure 3:
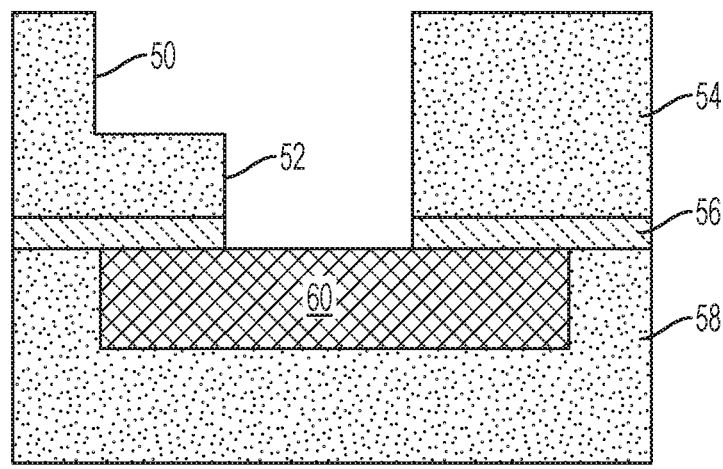
FIG. 3 depicts a cross-sectional view illustrating trench and via patterning formed in an interlevel dielectric layer according to an embodiment of the present invention.

Referring now to FIGS. 3-7, the process to form the structure depicted in FIGS. 1 and 2 in accordance with one or more embodiments generally begins with first forming the trench and via features 50, 52, respectively, in a dielectric layer 54, e.g., an interlevel dielectric layer (ILD), deposited on a capping layer 56 as shown in FIG. 3. The trench and via features 50, 52 respectively, are formed through lithography and etching processes, e.g., a dual damascene process. The structure may further include a dielectric layer 58 underlying the capping layer 56, wherein a copper metal interconnect 60 has previously been formed in the dielectric layer 58. It should be apparent that the underlying metal layer could be other conductive metals such as, for example, tungsten, which is commonly utilized in the metal 1 layer. The present invention is not intended to be limited to copper metal in this or any of the other embodiments disclosed herein. Moreover, it should be noted that one having skill in the art knows that a portion of an integrated circuit can comprise any number of interconnects and dielectric layers such as to form the desired semiconductor device.

The via features 52 expose a portion of the underlying copper metal interconnect 60, which is utilized to provide electrical contact therewith upon subsequent metallization of the trench and via features 50, 52, respectively.

The lithographic step generally includes applying a photoresist to the surface of the dielectric layer, exposing the photoresist to a desired pattern of radiation, and developing the exposed resist utilizing a photoresist developer to form a pattern.

The etching process may be a dry etching or wet etching process.

The term "wet etching" generally refers to application of a chemical solution. This is preferably a time controlled dip in the etch solution. Preferred etch solutions include $HNO_3$, HCL, $H_2SO_4$, HF or combinations thereof.

The term "dry etching" is used here to denote an etching technique such as reactive-ion-etching (ME), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the contact holes.

Figure 4:
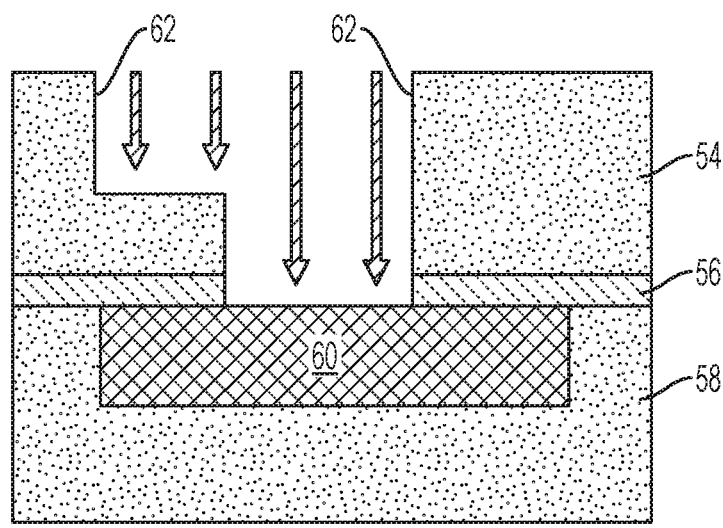
FIG. 4 depicts a schematic cross-sectional view illustrating a two-step cleaning process to enhance liner adhesion to the dielectric layer and surface clean, wherein a nitrogen-enriched layer is formed.

Referring now to FIG. 4, the patterned substrate is then subjected to a two-step plasma pre-treatment process to enhance liner adhesion to the dielectric, to nitridize the exposed surfaces of the dielectric layer 54 defined by the trench and via features 50, 52 for subsequent formation of the AlOxNy liner layer, and to provide surface cleaning of the underlying exposed portion of the metal layer 60.

The first step includes selective nitridization of the exposed dielectric surfaces 54. In this step, the surfaces of the trench and via 50, 52 are exposed to nitrogen ions generated from a nitrogen-containing gas to form a nitrogen enriched dielectric layer 62 on/in the dielectric layer 54. The generation of the nitrogen ions can be plasma or thermally generated, wherein the nitrogen ions penetrate into at least a portion of the dielectric layer surface 54.

As defined herein, the nitrogen-containing gas is selected from the group consisting of nitrogen ($N_2$) and ammonia ($NH_3$). Upon exposure to a suitable energy source, the nitrogen or ammonia dissociates to form nitrogen ions, which are then utilized to enrich a contact surface such as the exposed surfaces of the dielectric layer with nitrogen ions. Suitable energy sources include, but are not limited to, plasma energy sources and thermal energy sources.

Plasma nitridization generally includes exposing the nitrogen-containing gas to a plasma energy source effective to generate the nitrogen ions from the nitrogen containing gas. The substrate including the exposed dielectric layer surfaces of the trench and via are then exposed to the nitrogen ions to form a nitrogen enriched surface that also penetrates the respective surface to form a nitrogen enriched gradient in the dielectric layer. The process temperature is between 80 to 400° C., and the bias is typically between 100 to 900 W.

Thermal nitridization provides a similar effect as plasma nitridization but generally includes exposing the substrate to a temperature effective to generate nitrogen ions from the nitrogen containing gas. Again, the nitrogen ions contact and penetrate the exposed surface of the dielectric layer so as to form a nitrogen enriched gradient in the dielectric layer. The process temperature is generally between 200 to 400° C.

A plasma treatment is then performed to clean the exposed copper metal surface 60 at the bottom of the via of contaminants, oxides, nitrides, or the like. The process gases preferably include, but are not limited to, $H_2$, forming gas, $O_2$ and combinations thereof and a carrier gas. The carrier gases preferably include inert gases, He, Ne, Ar, Kr, Xe and Rn, and combinations thereof. The process conditions preferably include a temperature of between about room temperature and about 450° C., a pressure of between about 0.5 mtorr and about 100 torr, an RF power of between about 50 W and about 5 KW, and a process time of between about 5 seconds and about 600 seconds.

Figure 5:
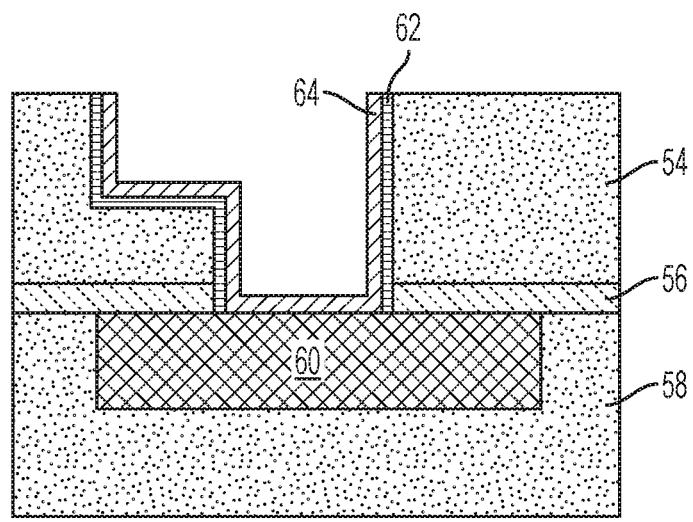
FIG. 5 depicts a schematic cross sectional view illustrating the structure of FIG. 4 after deposition of aluminum, wherein AlOxNy is formed at an interface between the aluminum layer and the dielectric layer.

In FIG. 5, a conformal layer 64 of Al is deposited. The thickness of the layer is 0.5 to 250 Angstroms (Å). Suitable processes for depositing the conformal layer of Al include, but are not limited to, chemical atomic layer deposition (ALD), chemical vapor deposition (CVD), plasma enhanced chemical vapor deposition (PECVD), sputtering, chemical solution deposition, or plating. By way of example, in the chemical vapor deposition process, metal organic source gases are used to deposit an aluminum layer at a temperature of about 215° to 325° C., and a deposition pressure of about 500 millitorr to about 100 torr. Preferably, dimethyl aluminum hydride (DMAH) is used as a deposition precursor. Alternatively, other metal organic precursors, such as tri-isobutyl aluminum (TIBA), trimethyl aluminum (TMA), trimethyl aluminum alane (TMAA), triethyl aluminum, and aluminum monochloride, and the like, can be used. The processing conditions utilized during the deposition process are effective for the nitrogen ions to react with the Al (and oxygen species in the dielectric) so as to form the AlOxNy liner layer 66 at the interface between the dielectric layer 54 and the aluminum layer 64.

Figure 6:
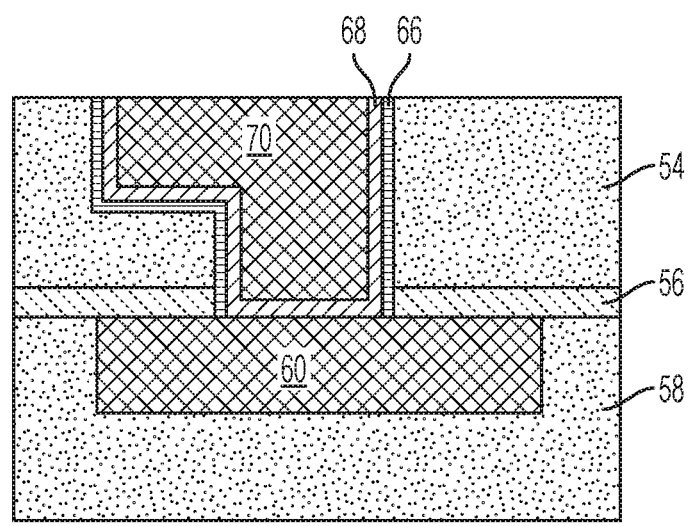
FIG. 6 depicts a schematic cross-sectional view illustrating the structure of FIG. 5 after deposition of a copper metal within the lined trench and via structure.

The pattern is then filled with a conductive metal 70 such as copper to form the interconnect structure as shown in FIG. 6. Filling the pattern with a copper metal may include first depositing a copper seed layer by an electroplating or an electroless process. The copper seed layer may be also deposited by sputtering. The seed layer would typically be about 50 to 400 Å thick. A thick copper film 70 may then be electroplated or may be deposited by electroless methods onto the seed layer. After the copper metal has been deposited, chemical mechanical polishing (CMP) can be used to remove any excess copper and to provide a planar surface. CMP is a synergistic process that removes material through the physical grinding of a slurry containing abrasive particles such as silica, as well as through chemical action as a result of oxidizing agents such as hydrogen peroxide contained in the slurry.

Figure 7:
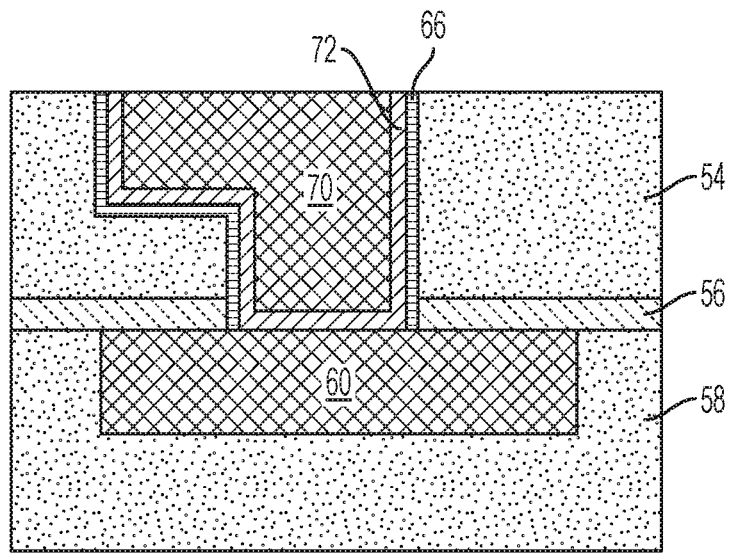
FIG. 7 depicts a schematic cross-sectional view illustrating the structure of FIG. 6 subsequent to an annealing step.

As shown in FIG. 7, the process then includes an annealing step at an elevated temperature and time, which causes the initial copper grains to grow into larger final grains, generates the desired amount of tensile stress, improves the microstructure of the copper interconnects, and improves the electrical properties of the copper interconnects. In addition, annealing results in interdiffusion of the copper and aluminum at about the interface of the trench and via, thereby increasing electromigration resistance. In an example application, the anneal conditions are a temperature of 200° C. for 30 minutes. However, any suitable annealing process is within the scope of the invention. For example the anneal temperature may range from 100-300° C., and the time for the anneal may range from 10 minutes to 1 hour.

Figure 8:
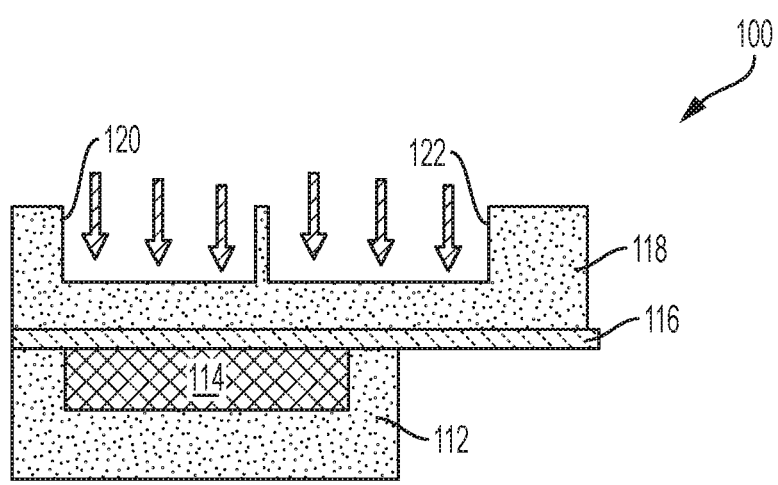
FIG. 8 illustrates a cross sectional view of a semiconductor device including first and second trenches formed via an etch process.
Figure 9:
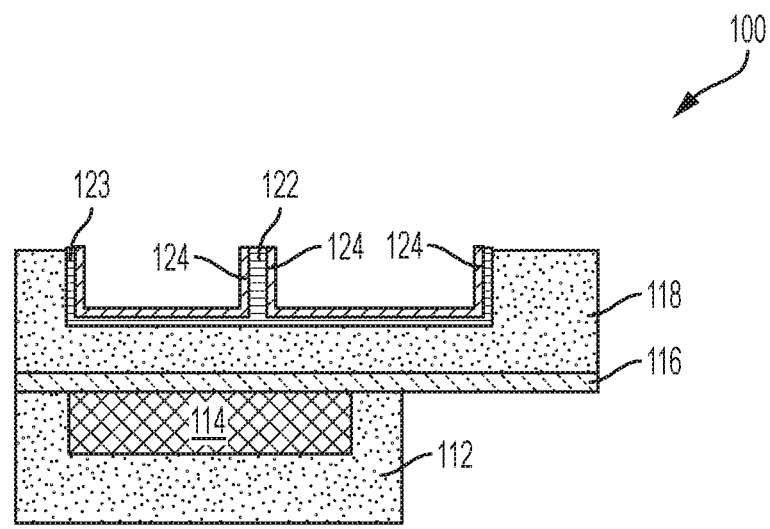
FIG. 9 illustrates a cross sectional view of a semiconductor device of FIG. 8 subsequent to conformal deposition of aluminum and formation of AlOxNy at an interface between the aluminum and a dielectric layer.
Figure 10:
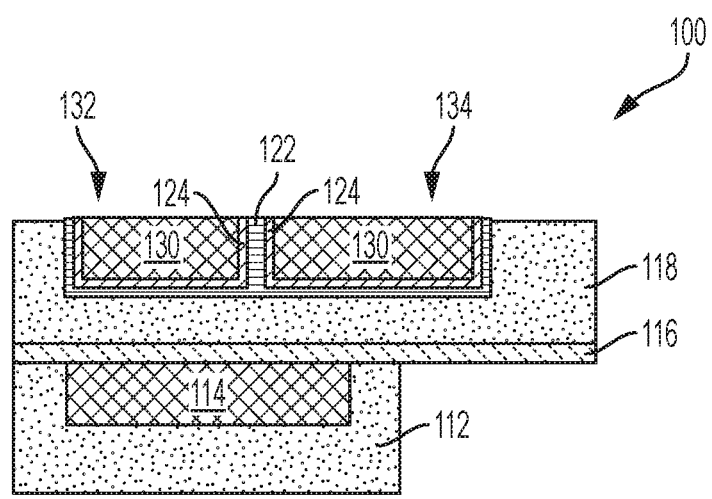
FIG. 10 illustrates copper metallization including seed layer deposition followed by copper electroplating.

In one or more other embodiments shown in FIGS. 8-10, the process of forming metallized copper layers may be employed for forming capacitor circuits. The capacitor circuits may be constructed at various levels within the semiconductor device. As shown in FIG. 8, an exemplary semiconductor device 100 is shown. The semiconductor device 100 generally includes a first dielectric layer 112, a first copper metal layer 114, a capping layer 116 disposed thereon, a second dielectric layer 118, and first and second trench features 120, 122, respectively, formed in the second dielectric layer 118. The spacing between the first and second trench is 10 Angstroms to 200 Angstroms in most embodiments, although a greater or less spacing is also contemplated.

The patterned feature may be subjected to a nitridization process to provide nitrogen ions, wherein the nitrogen ions penetrate into at least a portion of the exposed trench surfaces 120, 122 to form a nitrogen enriched dielectric layer 123. The generation of the nitrogen ions can be plasma or thermally generated as discussed above.

In FIG. 9, a thin conformal layer of aluminum 124 is then deposited by PVD or CVD and $Al_2O_3$ is naturally formed at the aluminum and dielectric interface, which because of the spacing merges, which can be used to form a capacitor structure in the trenches. In the presence of the nitrogen ions, the merger results in the formation AlOxNy layer, which can be used to separate the trenches 120, 122.

In FIG. 10, the pattern is filled with a conductive metal 130 such as copper to form the first and second copper electrodes 132, 134, respectively in the trenches 120, 122 as shown in FIG. 11. A seed layer may first be deposited by an electroplating or an electroless process. The seed layer may be also deposited by sputtering. The seed layer would typically be about 500 to 400 Å thick. A thick copper film may then be electroplated or may be deposited by electroless methods onto the seed layer. After the copper metal has been deposited, chemical mechanical polishing (CMP) can be used to remove any excess copper and to provide a planar surface. CMP is a synergistic process that removes material through the physical grinding of a slurry containing abrasive particles such as silica, as well as through chemical action as a result of oxidizing agents such as hydrogen peroxide contained in the slurry.

The process then includes an annealing step at an elevated temperature and time. The anneal process causes the initial copper grains to grow into larger final grains, generates the desired amount of tensile stress, improves the microstructure of the copper interconnects, and improves the electrical properties of the copper interconnects. In an example application, the anneal conditions are a temperature of 200° C. for 30 minutes. However, any suitable annealing process is within the scope of the invention. For example the anneal temperature may range from 100-300° C. and the time for the anneal may range from 10 minutes to 1 hr. Moreover, the aluminum at the interface between the metal layer and the aluminum layer forms a copper aluminum alloy.

Advantageously, the increased effectiveness of the merged liner between the trenches provides a means to increase capacitor density.

All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device, comprising:
    an interconnect structure comprising:
        a planar surface defined by a first metal layer disposed in a patterned first dielectric layer;
        a patterned second dielectric layer overlaying the first metal and the first dielectric layer;
        a second metal layer comprising copper disposed in the patterned second dielectric layer;
        a barrier layer at an interface between the second dielectric layer and the second metal layer, wherein the barrier layer is aluminum oxynitride;
        a copper-aluminum alloy at an interface between the first metal layer and the second metal layer, and at an interface between the second metal layer and the barrier layer.

2. The semiconductor device of claim 1, wherein the interconnect structure further comprises a capping layer overlaying the patterned first dielectric layer and the first metal layer.

3. The semiconductor device of claim 1, wherein the patterned second dielectric layer comprises a trench and via structure.

4. The semiconductor device of claim 3, wherein the via structure has a bottom surface that is free of the barrier layer such that the second metal layer is in direct contact with an underlying first metal layer.

5. The semiconductor device of claim 3, wherein the first metal layer comprises copper or tungsten.

6. The semiconductor device of claim 3, wherein the patterned second dielectric layer is formed on a capping layer, the capping layer overlying a first metal layer formed in the first dielectric layer, wherein the via structure exposes the underlying metal layer.

7. The semiconductor device of claim 1, wherein the patterned second dielectric layer comprises a first trench and a second trench separated by a merged liner, wherein the merged liner comprises $Al_2O_3$.

8. The semiconductor device of claim 1, wherein the patterned second dielectric layer comprises a first trench and a second trench separated by a common wall, wherein the common wall comprises an aluminum oxynitride.

9. The semiconductor device of claim 8, further comprising a copper aluminum alloy at an interface between the second metal layer and the common wall.

10. The semiconductor device of claim 1, wherein the aluminum oxynitride barrier layer is at a thickness of 0.5 to 250 Angstroms.

* * * * *